(12) United States Patent
Kobayashi et al.

(10) Patent No.: US 7,325,298 B2
(45) Date of Patent: Feb. 5, 2008

(54) PRESSURE APPARATUS AND CHIP MOUNTER

(75) Inventors: Taizan Kobayashi, Kawasaki (JP); Eiji Takada, Kawasaki (JP); Makoto Kuboyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 396 days.

(21) Appl. No.: 11/066,173

(22) Filed: Feb. 28, 2005

(65) Prior Publication Data

US 2006/0112541 A1 Jun. 1, 2006

(30) Foreign Application Priority Data

Nov. 30, 2004 (JP) .............. 2004-347615

(51) Int. Cl.
*B23P 19/00* (2006.01)
*A47J 45/00* (2006.01)

(52) U.S. Cl. .............. 29/740; 29/739; 29/741; 29/742; 29/743; 294/64.1

(58) Field of Classification Search .............. 29/739, 29/740, 741, 743, 832, 833, 742; 414/752.1, 414/749.3, 738; 294/64.1
See application file for complete search history.

(56) References Cited

U.S. PATENT DOCUMENTS 4,631,834 A * 12/1986 Hayashi et al. .............. 33/503
4,979,290 A * 12/1990 Chiba .............. 29/840
5,724,722 A * 3/1998 Hashimoto .............. 29/740
6,178,621 B1 * 1/2001 Shida et al. .............. 29/740
6,266,873 B1 * 7/2001 Kitamura et al. .............. 29/832
6,289,256 B1 * 9/2001 Takeda et al. .............. 700/121

FOREIGN PATENT DOCUMENTS

JP 2003-229442 8/2003

* cited by examiner

*Primary Examiner*—A. Dexter Tugbang
*Assistant Examiner*—Tai Van Nguyen
(74) *Attorney, Agent, or Firm*—Westerman, Hattori, Daniels & Adrian, LLP.

(57) ABSTRACT

A contact member is supported on the support shaft. A force sensor is coupled to the support shaft. A movable member is coupled to the force sensor. The pressure apparatus allows the movable member to cause the axial movement of the support shaft. A first guide serves to guide the axial movement of the support shaft. The first guide is supported on the support member. The support member stands still during the movement of the movable member. Accordingly, the movement of the movable member is restrained in the axial direction. The contact member is thus prevented from suffering from a swinging movement around the force sensor. Servo control of a higher frequency bandwidth can be applied to the movement of the contact member. The contact member moves at a higher velocity. Occurrence of resonance is still avoided in the contact member. The tact time can be shortened.

5 Claims, 3 Drawing Sheets

PRESSURE APPARATUS AND CHIP MOUNTER

BACKGROUND OF THE INVENTION

1. Field of the Invention

The present invention relates to a pressure apparatus. In particular, the invention relates to a pressure apparatus incorporated in a chip mounter designed to mount an electronic component chip on a printed circuit board.

2. Description of the Prior Art

As disclosed in Japanese Patent Application Publication No. 2003-229442, for example, a chip mounter is well known. A contact member such as a head is opposed to the upper surface of a work stage in the chip mounter. The chip mounter includes a movable member designed to move in the direction perpendicular to the upper surface of the work stage. A guide is disposed to support the movement of the movable member. A support shaft is attached to the lower end of the movable member. A head is fixed to the lower end of the support shaft. A load cell is interposed between the support shaft and the movable member. When the head is urged against a substrate on the work stage, the load cell is employed to measure the magnitude of the pressure force.

The head of the chip mouter often suffers from swinging movement around the load cell based on the imbalance of the mass. This swinging movement of the head induces the resonance at a lower frequency of a servo control bandwidth. The resonance at the lower frequency hinders accomplishment of the positioning of the head at a higher speed. The tact time cannot be shortened in the chip mounter.

SUMMARY OF THE INVENTION

It is accordingly an object of the present invention to provide a pressure apparatus and a chip mounter contributing to realization of a shortened working period or tact time.

According to the present invention, there is provided a pressure apparatus comprising: a support shaft; a contact member supported on the support shaft; a first guide designed to guide the axial movement of the support shaft along the longitudinal axis of the support shaft; a force sensor coupled to the support shaft; a movable member coupled to the force sensor; a second guide designed to guide the movement of the movable member in parallel with the longitudinal axis of the support shaft; a drive source connected to the movable member, said drive source exhibiting a driving force causing the movement of the movable member; and a support member supporting the first guide, said support member staying in a still state during the movement of the movable member.

The pressure apparatus allows the movable member to cause the axial movement of the support shaft. In this case, the first guide serves to guide the axial movement of the support shaft. The first guide is supported on the support member. The support member stands still or static during the movement of the movable member. Accordingly, the movement of the movable member is restrained in the axial direction. The contact member is thus prevented from suffering from a swinging movement around the force sensor. Servo control of a higher frequency bandwidth can be applied to the movement of the contact member. The contact member is allowed to move at a higher velocity. Occurrence of resonance is still avoided in the contact member. The contact member can be positioned at a predetermined position in a shorter period. The pressure apparatus is allowed to enjoy a shortened working period or tact time.

The first guide may be a non-contact guide effecting a predetermined force to the support shaft from at least pairs of opposite directions. A physical contact is thus reliably avoided between the support shaft and the first guide. The friction is avoided between the support shaft and the first guide. The support shaft thus starts moving in response to a driving force of a smaller magnitude. The load applied to the contact member can accurately be detected in the force sensor at a higher resolution. The pressure force of the contact member can be controlled with a higher accuracy. The force may employ a static pressure based on air, for example. On the other hand, if a contact guide is employed as the first guide, for example, a friction is induced between the support shaft and the first guide, so that the support shaft cannot start moving in response to a driving force of a smaller magnitude. The resolution of the force sensor in this manner depends upon the magnitude of the friction established in the first guide.

The second guide may likewise be a non-contact guide effecting a predetermined force to the movable member from at least pairs of opposite directions. A physical contact is reliably avoided between the movable member and the second guide. The friction is avoided between the movable member and the second guide. The support shaft thus starts moving in response to a driving force of a smaller magnitude. The load applied to the contact member can further accurately be detected in the force sensor at a higher resolution. The pressure force of the contact member can be controlled with a further higher accuracy. The force may employ a static pressure based on air, for example.

The force sensor may comprise: a connecting piece designed to connect the support shaft to the movable member; and a strain gauge attached to the connecting piece. The deformation of the connecting piece induces a strain in the strain gauge. A load is measured based on the strain. The strain gauge realizes an accurate measurement of a load based on a deformation of a larger amount. The larger the deformation gets in the strain gauge, the higher the accuracy of the measurement gets. The first guide serves to prevent generation of resonance in the contact member even if the connecting piece is apt to largely deform in response to application of a smaller load so as to obtain a larger deformation of the strain gauge.

The voice coil motor may be employed as the drive source. The voice coil motor enables a faster movement of the movable member, the support shaft and the contact member as compared with a driving mechanism utilizing a ball screw, air pressure, or the like. The tact time can be shortened.

The pressure apparatus may be incorporated within a chip mounter. The chip mounter may include a work table defining an upper surface along a horizontal plane; a support shaft having the longitudinal axis in the direction perpendicular to the horizontal plane; a contact member support on the support shaft, said contact member opposed to the work table; a first guide designed to guide the axial movement of the support shaft along the longitudinal axis of the support shaft; a force sensor coupled to the support shaft; a movable member coupled to the force sensor; a second guide designed to guide the movement of the movable member in parallel with the longitudinal axis of the support shaft; a drive source connected to the movable member, said drive source exhibiting a driving force causing the movement of the movable member; and a support member supporting the first guide, said support member staying in a still state during the movement of the movable member.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
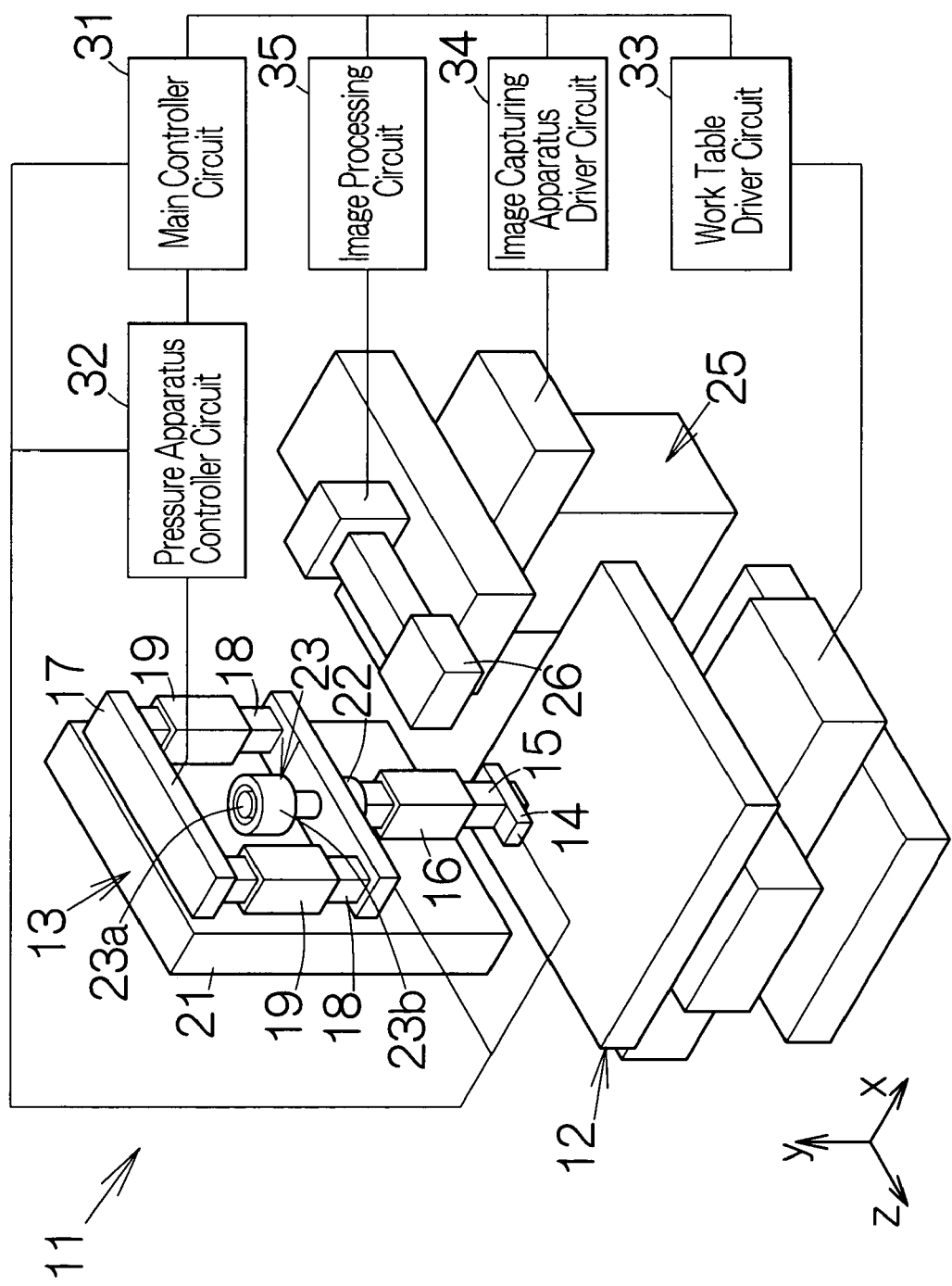
FIG. 1 is a perspective view schematically illustrating the structure of a chip mounter according to an embodiment of the present invention.

FIG. 1 schematically illustrates a chip mounter 11 according to an embodiment of the present invention. The chip mounter 11 includes a work table 12 defining the upper flat surface along a predetermined horizontal plane. The work table 12 is allowed to move within the horizontal plane. The work stage 12 is designed to receive a printed circuit board on the upper flat surface.

Here, the xyz-coordinate system is established in the chip mounter 11. The y-axis of the xyz-coordinate system extends in the direction perpendicular to the upper flat surface of the work table 12, namely to the horizontal plane. The work table 12 is driven in the x-axis and in the y-axis. The position of the work table 12 can be identified with the x-coordinate and the y-coordinate.

A pressure apparatus 13 is related to the work table 12. The pressure apparatus 13 includes an ultrasonic head 14 serving as a contact member according to the present invention. The ultrasonic head 14 serves to hold a circuit component chip at the lower end opposed to the upper flat surface of the work table 12. An ultrasonic oscillator is incorporated within the ultrasonic head 14 so as to generate an ultrasonic vibration. The ultrasonic is transmitted from the ultrasonic oscillator to the chip. The ultrasonic serves to induce the vibration of the ultrasonic head 14 in the horizontal direction, for example.

The ultrasonic head 14 is allowed to move in the direction perpendicular to the upper flat surface of the work table 12 along the y-axis of the xyz-coordinate system, as described later. The vertical movement of the ultrasonic head 14 is employed to urge the chip to a printed circuit board on the upper flat surface of the work table 12. The ultrasonic is transmitted to the chip in this situation. The ultrasonic head 14 thus realizes ultrasonic bonding based on the ultrasonic vibration of the ultrasonic head 14.

The pressure apparatus 13 includes a support shaft 15 having the longitudinal axis in parallel with the y-axis. The ultrasonic head 14 is fixed to the lower end of the support shaft 15. The support shaft 15 may be shaped into a prism, for example. The support shaft 15 may be made of a metallic material, for example. A first guide 16 is employed to guide the movement of the support shaft 15. The first guide 16 may be shaped into a cylinder having a polygonal cross-section, for example. The first guide 16 may be made of a resin material, for example.

The first guide 16 is a so-called non-contact guide, for example. The non-contact guide is designed to effect a predetermined force to the peripheral surface of the support shaft 15 from at least pairs of directions. The predetermined force may include a force such as magnetic force based on atoms, a static pressure based on fluid such as air, or the like. Here, the first guide 16 employs a static pressure based on air. The first guide 16 serves to guide the axial movement of the support shaft 15 along the longitudinal axis of the support shaft 15.

A movable member 17 is coupled to the support shaft 15. Here, the movable member 17 is formed of a frame member. The movable member 17 includes a pair of guide shaft 18, 18 having the longitudinal axis in parallel with the y-axis. The guide shaft 18 may be shaped into a prism, for example. The guide shaft 18 may be made of a metallic material, for example. A second guides 19 are employed to guide the movement of the guide shafts 17. The second guide 19 may be shaped into a cylinder having a polygonal cross-section, for example. The second guide 19 may be made of a resin material, for example.

The second guide 19 is a so-called non-contact guide, for example, in the same manner as the first guide 16. The non-contact guide is designed to effect a predetermined force to the periphery of the guide shaft 18 from at least pairs of directions. Here, the second guide 18 employs a static pressure based on air. The second guide 18 serves to guide the vertical movement of the guide shaft 18, namely of the movable member 17, in parallel with the longitudinal axis of the support shaft 15 or the y-axis.

The pressure apparatus 13 further includes a support member 21. The support member 21 is designed to support the first and second guides 16, 19. Here, the first and second guides 16, 19 are stationarily located on the support shaft 21. The support member 21 is designed to stay in the static or still state even during the movement of the movable member 17. Specifically, the support shaft 15 and the movable member 17 are allowed to move relative to the support member 21 as well as the first and second guides 16, 19.

A force sensor 22 is interposed between the support shaft 15 and the movable member 17. The force sensor 22 is designed to detect a force or load acting on the support shaft 15 in the direction of the y-axis. The force sensor 22 serves to convert the load to an electric signal. The force sensor 22 will be described later in detail.

A drive source or voice coil motor 23 is connected to the movable member 17. The voice coil motor 23 is designed to exhibit a driving force causing the movement of the movable member 17. The voice coil motor 23 includes a columnar permanent magnet 23a, and a cylindrical coil 23b receiving the columnar permanent magnet 23a inside, for example. The inner surface of the coil 23b is thus opposed to the outer surface of the permanent magnet 23a. The permanent magnet 23a is fixed to the movable member 17. The coil 23b is fixed to the support member 21. The coil 23b serves to generate a magnetic field based on a supplied electric current. The magnetic field of the coil 23b reacts to the magnetic field of the permanent magnet 23a. The movable member 17 is thus driven to move in the vertical direction along the y-axis. The movement of the movable member 17 in this manner induces the vertical movement of the force sensor 22, the support shaft 15 and the ultrasonic head 14.

An image capturing apparatus 25 is related to the work table 12 and the pressure apparatus 13. The image capturing apparatus 25 is allowed to move in the horizontal direction along the z-axis relative to the work table 12. The image capturing apparatus 25 includes a camera unit 26 designed to capture images. When the image capturing apparatus 25 moves in the horizontal direction, the camera unit 26 is positioned in a space between the ultrasonic head 14 and the work table 12. The camera unit 26 serves to simultaneously capture an image of a chip held on the ultrasonic head 14 and an image of a printed circuit board placed on the upper flat surface of the work table 12. The captured images, namely the pictures are utilized to determine the position of the printed circuit board on the work stage 12.

The chip mounter 11 includes a main controller circuit 31. The main controller circuit 31 is designed to control the operation of the chip mounter 11 in accordance with a predetermined software program. The main controller circuit 31 supplies the ultrasonic oscillator in the ultrasonic head 14 with a predetermined electric signal. The ultrasonic head 14 is allowed to generate an ultrasonic vibration in response to the supply of the electric signal.

A pressure apparatus controller circuit 32 is connected to the main controller circuit 31. The pressure apparatus controller circuit 32 is designed to supply the coil 23b with electric current. The vertical movement of the movable member 17 is caused in response to the supply of the electric current as described above. The ultrasonic head 14 is thus allowed to move along the y-axis relative to the work table 12. Servo control is effected in the pressure apparatus controller circuit 32 so as to realize the vertical movement of the ultrasonic head 14. The pressure apparatus controller circuit 32 is also designed to detect the load based on the electric signal supplied from the force sensor 22.

A work table driver circuit 33 is connected to the main controller circuit 31. The work table driver circuit 33 is designed to supply a predetermined electric signal to an electric motor incorporated within the work table 12, for example. A predetermined control signal may be supplied to the work table driver circuit 33 from the main controller circuit 31 so as to realize the supply of the electric signal. The work table 12 is allowed to move in the horizontal direction in parallel with the x- and z-axes based on the supplied electric signal.

An image capturing apparatus driver circuit 34 is connected to the main controller circuit 31. The image capturing apparatus driver circuit 34 is designed to supply a predetermined electric signal to an electric motor incorporated within the image capturing apparatus 25, for example. A predetermined control signal may be supplied to the image capturing apparatus driver circuit 34 from the main controller circuit 31 so as to realize the supply of the electric signal. The image capturing apparatus 25 is allowed to move in the horizontal direction in parallel with the z-axis based on the supplied electric signal.

An image processing circuit 35 is connected to the main controller circuit 31. The image processing circuit 35 is designed to supply the camera unit 26 with a predetermined control signal. The camera unit 26 is designed to capture images of a printed circuit board placed on the work table 12 in response to the supply of the control signal. The image processing circuit 35 is also designed to analyze the image output from the camera unit 26. A predetermined control signal may be supplied to the image processing circuit 35 from the main controller circuit 31 so as to realize the supply of the control signal.

Figure 2:
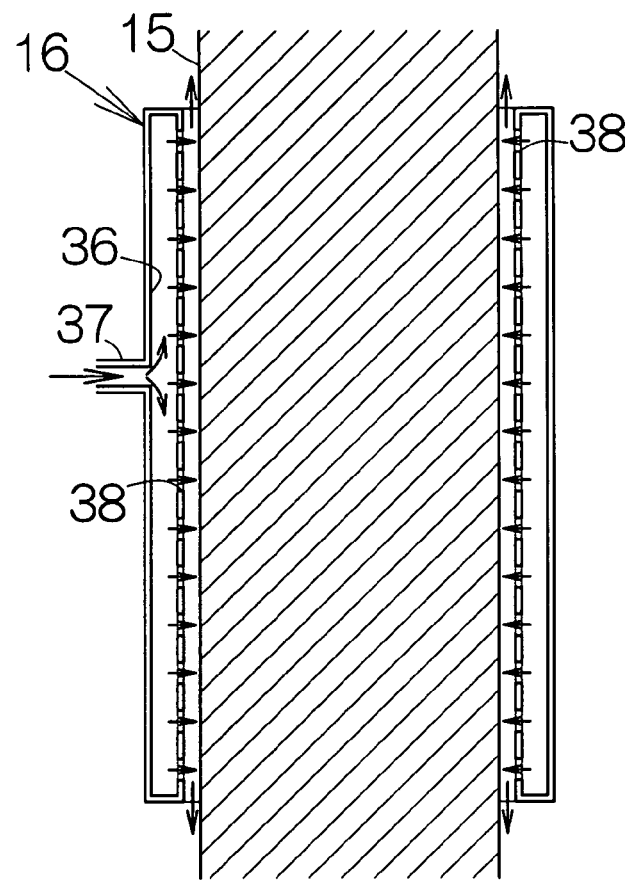
FIG. 2 is a sectional view schematically illustrating the structure of first and second guides.

As shown in FIG. 2, the inner surface of the first guide 16 is opposed to the outer surface of the support shaft 15. The first guide 16 defines an inner space 36. The first guide 16 includes an inlet 37 defined at the outer surface of the first guide 16 and outlets 38 defined at the inner surface. An air supply source, not shown, is connected to the inlet 37. The outlets 36 are designed to connect the inner space 36 to an inside space defined inside the inner surface. A predetermined space may be kept between the outer surface of the support shaft 15 and the inner surface of the first guide 16.

Air is continuously supplied to the inlet 37 of the first guide 16 from the air supply source. The air is forced to flow into the inner space 36 from the inlet 37 at a predetermined flow rate. The introduced air is then discharged out of the outlets 38 in the directions perpendicular to the longitudinal axis of the support shaft 15. The discharged air is allowed to flow into a narrow space between the support shaft 15 and the inner surface of the first guide 16. Here, the air pressure serves to keep the space between the first guide 16 and the support shaft 15. The first guide 15 is thus allowed to support the support shaft 15 without contacting with the support shaft 15. The guide shaft 18 and the second guide 19 have the structure similar to that of the support shaft 15 and the first guide 16.

Figure 3:
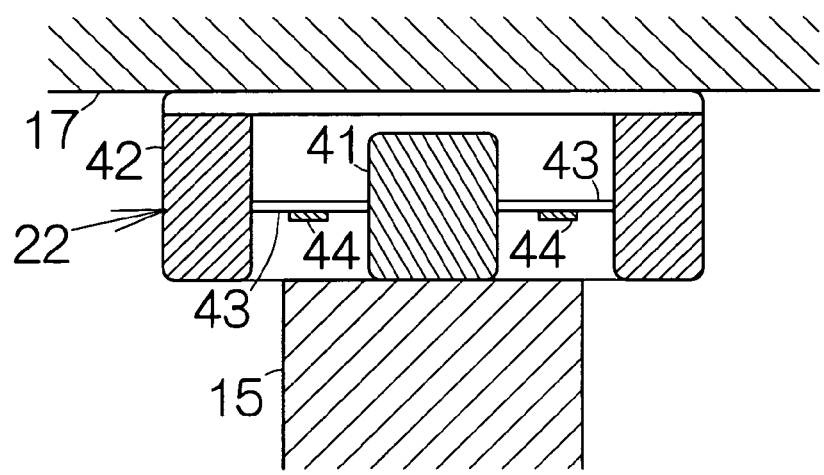
FIG. 3 is a sectional view schematically illustrating the structure of a force sensor.

As shown in FIG. 3, the force sensor 22 includes a center shaft 41 and an annular member 42 surrounding the center shaft 41. Connecting pieces 43 connect the center shaft 41 to the annular member 42. The connecting pieces 43 radiate from the center shaft 41 in four directions, for example. A strain gauge 44 is attached on the individual connecting piece 43. The lower end of the center shaft 41 is coupled to the upper end of the support shaft 15. The annular member 42 is coupled to the lower end of the movable member 17. The connecting pieces 43 serve to connect the support shaft 15 and the movable member 17 to each other.

Electric current is supplied to the strain gauges 44. When the movable member 17 serves to urge the ultrasonic head 14 against the work table 12, for example, the support shaft 15 lifts up the center shaft 41 in the y-axis toward the movable member 17. The center shaft 41 moves upward relative to the annular member 42. Strain is induced in the connecting pieces 43. Electric resistance is correspondingly changed in the strain gauges 44. This change in the electric resistance is reported to the pressure apparatus controller circuit 32 in the form of electric signals.

Now, assume that a circuit component chip is to be mounted on a printed circuit board. The printed circuit board is placed on the upper flat surface of the work table 12. The chip is held on the ultrasonic head 14. Ball bumps are arranged on the lower surface of the chip. The ball bumps may be made of an electrically conductive material such as copper, for example. A position mark is printed on the lower surface of the chip. A position mark is likewise printed on the upper surface of the printed circuit board so as to identify the position of the chip.

The ultrasonic head 14 is first positioned at a predetermined first position. The ultrasonic head 14 at the first position is spaced from the work table 12 at a distance. The main controller circuit 31 switches on the air supply source. Air is continuously supplied to the first and second guides 16, 19 from the air supply source. The air is forced to flow into the inner space 36 through the inlet 37. The air is then discharged from the outlets 38. A constant predetermined space is thus established between the support shaft 15 and the first guide 16. A constant predetermined space is likewise established between the guide shaft 18 and the second guide 19.

The main controller circuit 31 then supplies the image capturing apparatus driver circuit 34 with a control signal. An electric signal is supplied to the image capturing apparatus 25 from the image capturing apparatus driver circuit 34 based on the control signal. The image capturing apparatus 25 is thus moved in the horizontal direction to a predetermined position in the z-axis. The camera unit 26 is positioned in a space between the ultrasonic head 14 and the work table 12. The main controller circuit 31 then supplies the image processing circuit 35 with a predetermined control signal. The image processing circuit 35 outputs a control signal to the camera unit 26. The supply of the control signal causes the camera unit 26 to simultaneously photograph the chip and the printed circuit board. The picture or captured image is supplied to the image processing circuit 35.

The image processing circuit 35 detects the position marks on the chip and the printed circuit board based on the captured images. The detected position is converted into a position signal. The position signal is supplied to the main controller circuit 31. The main controller circuit 31 calculates an amount of displacement between the position marks on the chip and the printed circuit board based on the position signal. The main controller circuit 31 then calculates the adjustment amount for the work table 12 based on the amount of displacement. The main controller circuit 31 may implement a predetermined software program so as to execute the calculations.

The main controller circuit 31 supplies the work table driver circuit 33 with a control signal derived from the adjustment amount. An electric signal is thus supplied to the work table 12 from the work table driver circuit 33. The work table 12 is allowed to move in the horizontal direction to a predetermined position. The position mark on the printed circuit board is in this manner aligned with the position mark on the chip. The image capturing apparatus 25 is thereafter withdrawn from the space between the ultrasonic head 14 and the work table 12.

The main controller circuit 31 then supplies the pressure apparatus controller circuit 32 with a control signal. The supply of the control signal causes the pressure apparatus controller circuit 32 to supply the coil 23*b* with electric current. The vertical movement of the movable member 17 and the ultrasonic head 14 is thus induced. The ultrasonic head 14 moves downward toward the work table 12. The ultrasonic head 14 is thus positioned at a predetermined second position. The chip is spaced from the printed circuit board at a distance when the ultrasonic head 14 takes the second position. When the ultrasonic head 14 further moves downward, the ultrasonic head 14 urges the chip against the printed circuit board. The ball bumps on the chip are forced to contact with corresponding electrically conductive pads on the printed circuit board. The electrically conductive pads may be made of an electrically conductive material such as copper, for example.

When the chip is urged against the printed circuit board, the support shaft 15 lifts up the center shaft 41 in the force sensor 22 in the y-axis. The center shaft 41 moves relative to the annular member 42. Strain is induced in the connecting pieces 43. The strain gauges 44 get deformed, so that electric resistance is changed. The change in the electric resistance is reported to the pressure apparatus controller circuit 32 in the form of an electric signal. The pressure apparatus controller circuit 32 detects the load based on the electric signal. The pressure apparatus controller circuit 32 supplies the coil 23*b* with electric current based on the detected load. This causes the movable member 17 and the ultrasonic head 14 to move in the vertical direction, so that the pressure force of the ultrasonic head 14 is kept constant at a predetermined level.

The main controller circuit 31 supplies the ultrasonic head 14 with an electric signal. The supply of the electric signal causes the ultrasonic oscillator to generate an ultrasonic vibration. The ultrasonic vibration is transmitted to the ultrasonic head 14 in the horizontal direction. The ultrasonic vibration of the ball bumps is thus induced. Plastic deformation is induced at contacts between the ball bumps and the electrically conductive pads based on the ultrasonic energy. Oxide films are broken at the contacts between the ball bumps and the electrically conductive pads. Exchanged metallic atoms diffuse into the ball bumps and the electrically conductive pads. The ball bumps are in this manner bonded to the corresponding electrically conductive pads. A so-called ultrasonic bonding is achieved.

The pressure controller circuit 32 then supplies the coil 23*b* with electric current. The ultrasonic head 14 moves upward. The ultrasonic head 14 is positioned at the first position. The printed circuit board is displaced from the work table 12 along with the chip. A printed circuit board and a chip are thereafter set on the work table 12 and the ultrasonic head 14 again. The chip mounter repeats the aforementioned processes. These processes are executed in three seconds, for example, after the set of the printed circuit board and chip to the accomplishment of the ultrasonic bonding.

The chip mounter 11 allows the first guide 16 to guide the vertical movement of the support shaft 15. The first guide 16 is fixedly supported on the support member 21. The support member 21 stands still during the movement of the movable member 17. Accordingly, the support shaft 15 is allowed to move only in the vertical direction. The ultrasonic head 14 is prevented from suffering from a swinging movement around the force sensor 22. Servo control of a higher frequency bandwidth can be applied to the movement of the ultrasonic head 14. The ultrasonic head 14 is allowed to move at a higher velocity. Occurrence of resonance is still avoided in the ultrasonic head 14. The ultrasonic head 14 can be positioned at the first and second positions in a shorter period. The chip mounter 11 is allowed to enjoy a shortened working period or tact time.

In addition, the non-contact guide is utilized as the first and second guides 16, 19. A physical contact is reliably avoided between the support shaft 15 and the first guide 16 as well as between the guide shafts 18 and the second guides 19. The friction is avoided between the support shaft 15 and the first guide 16 as well as between the guide shafts 18 and the second guides 19. The support shaft 15 thus starts moving in response to a driving force of a smaller magnitude. The load applied to the ultrasonic head 14 can accurately be detected in the force sensor 22 at a higher resolution. The pressure force of the ultrasonic head 14 can be controlled with a higher accuracy. On the other hand, if a contact guide is employed as the first guide, for example, a friction is induced between the support shaft and the first guide, so that the support shaft cannot start moving in response to a driving force of a smaller magnitude. The resolution of the force sensor 22 depends upon the magnitude of the friction established in the first and second guides.

The aforementioned force sensor 22 utilizes the strain gauges 44. The strain gauges 44 realize an accurate measurement of a load based on a deformation of a larger amount. The larger the deformation gets in the strain gauges 44, the higher the accuracy of the measurement gets. The first guide 16 serves to prevent generation of resonance in the ultrasonic head 14 even if the connecting pieces 43 are apt to largely deform in response to application of a smaller load so as to obtain a larger deformation of the strain gauges 44.

The voice coil motor 23 is employed as the drive source as described above. The voice coil motor 23 enables a faster movement of the movable member 17, the support shaft 15 and the ultrasonic head 14 as compared with a driving mechanism utilizing a ball screw, air pressure, or the like. The tact time can be shortened.

Figure 4:
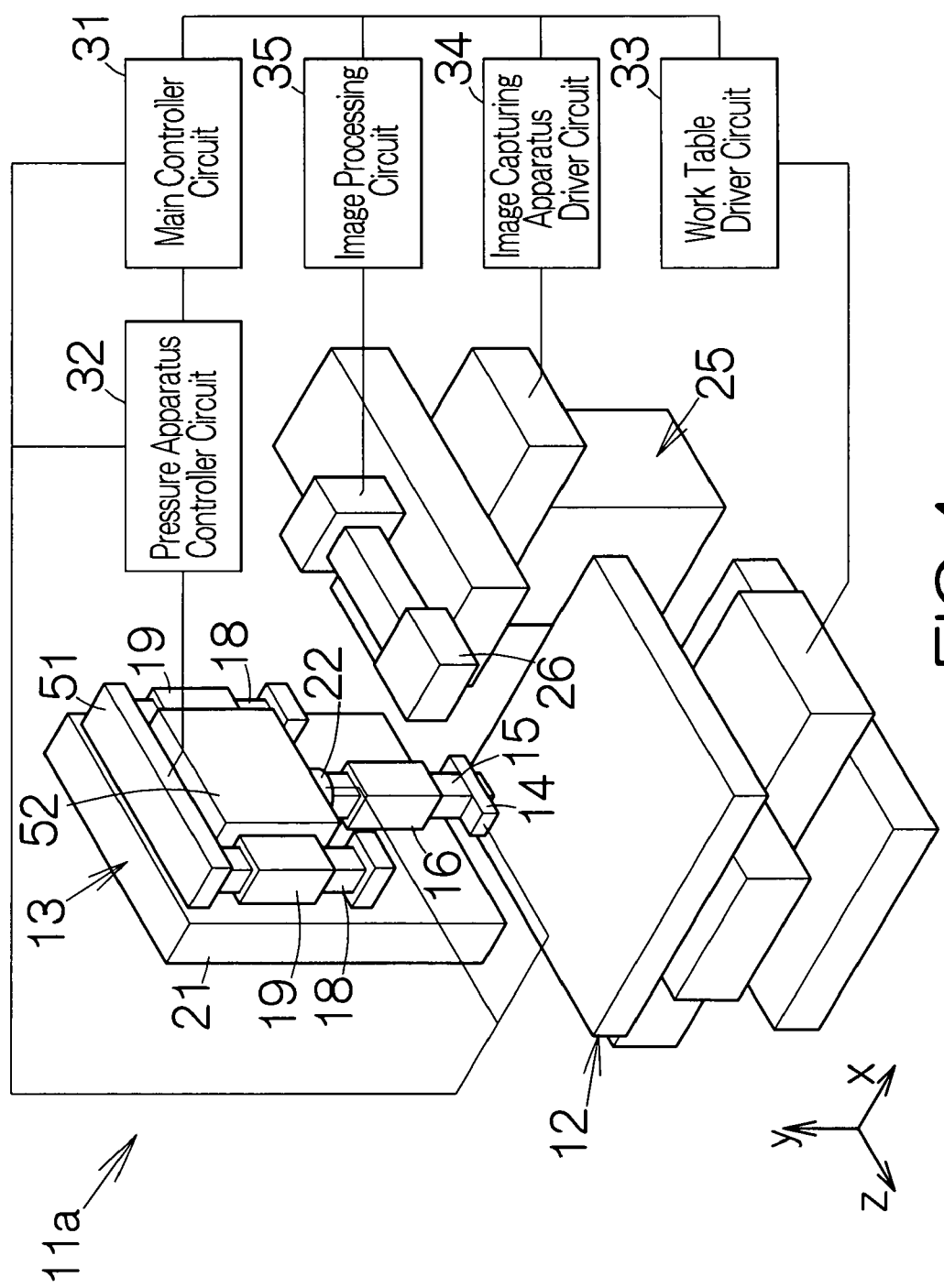
FIG. 4 is a perspective view schematically illustrating the structure of a chip mounter according to another embodiment of the present invention.

As shown in FIG. 4, for example, the chip mounter 11a may include the guide shafts 18 stationarily fixed to the support member 21. In this case, a frame member 51 defines the guide shafts 18. The frame member 51 is stationarily fixed to the support member 21. The second guides 19 are supported around the corresponding guide shafts 18. The second guides 19 are fixed to a movable member 52. The aforementioned voice coil motor 23 is incorporated within the movable member 52. The permanent magnet 23a is fixed to the movable member 52. The coil 23b is fixed to the support member 21. The voice coil motor 52 serves to cause the movement of the movable member 52. The second guides 19 in this manner guide the movement of the movable member 52. Like reference numerals are attached to components or structure equivalent to those of the aforementioned embodiment. The chip mounter 11a is allowed to enjoy advantages in the same manner as the aforementioned chip mounter 11.

A head holding a cutting bit or the like may be utilized, in place of the aforementioned ultrasonic head 14 as the contact member in the chip mounter 11, 11a. The pressure apparatus 13 may be incorporated within a cutting apparatus or the like.

What is claimed is:

1. A pressure apparatus comprising:
   a support shaft having an upper end and a lower end;
   a contact member fixed to the lower end of the support shaft;
   a first guide designed to guide an axial movement of the support shaft along a longitudinal axis of the support shaft, said first guide being a non-contact guide effecting a predetermined force to the support shaft from opposite directions;
   a force sensor coupled to the upper end of the support shaft;
   a movable member coupled to an upper surface of the force sensor, the movable member including a guide shaft;
   a second guide designed to guide movement of the movable member in parallel with the longitudinal axis of the support shaft, said second guide being a non-contact guide effecting a predetermined force to the guide shaft from opposite directions;
   a drive source connected to the movable member, said drive source exhibiting a driving force causing the movement of the movable member; and
   a support member contacting with the first guide and the second guide so as to support the first guide and the second guide, said support member staying in a still state during the movement of the movable member.

2. The pressure apparatus according to claim 1, wherein said force employs a static pressure based on air.

3. The pressure apparatus according to claim 1, wherein said force sensor comprises:
   a connecting piece designed to connect the support shaft to the movable member; and
   a strain gauge attached to the connecting piece.

4. The pressure apparatus according to claim 1, wherein said drive source includes a voice coil motor.

5. A chip mounter comprising:
   a work table defining an upper surface along a horizontal plane;
   a support shaft having a longitudinal axis in a direction perpendicular to the horizontal plane;
   a contact member fixed to a lower end of the support shaft, said contact member opposed to the work table;
   a first guide designed to guide an axial movement of the support shaft along the longitudinal axis of the support shaft, said first guide being a non-contact guide effecting a predetermined force to the support shaft from opposite directions;
   a force sensor coupled to an upper end of the support shaft;
   a movable member coupled to the upper surface of the force sensor, the movable member including a guide shaft;
   a second guide designed to guide movement of the movable member in parallel with the longitudinal axis of the support shaft, said second guide being a non-contact guide effecting a predetermined force to the guide shaft from opposite directions;
   a drive source connected to the movable member, said drive source exhibiting a driving force causing the movement of the movable member; and
   a support member contacting with the first guide and the second guide so as to support the first guide and the second guide, said support member staying in a still state during the movement of the movable member.

* * * * *